United States Patent
Leuschner et al.

(10) Patent No.: US 7,344,896 B2
(45) Date of Patent: Mar. 18, 2008

(54) FERROMAGNETIC LINER FOR CONDUCTIVE LINES OF MAGNETIC MEMORY CELLS AND METHODS OF MANUFACTURING THEREOF

(75) Inventors: Rainer Leuschner, Corbeil Essones (FR); Wolfgang Raberg, Fontainebleau (FR); Stephen L. Brown, Carmel, NY (US); Frank Findeis, Munich (DE); Sivanandha K. Kanakasabapathy, Hopewell Junction, NY (US); Michael Vieth, Moehrendorf (DE)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 155 days.

(21) Appl. No.: 10/899,488

(22) Filed: Jul. 26, 2004

(65) Prior Publication Data

US 2006/0019487 A1    Jan. 26, 2006

(51) Int. Cl.
*H01L 21/00* (2006.01)

(52) U.S. Cl. ............................. 438/3; 257/295
(58) Field of Classification Search ............... 257/295, 257/421, 422, 427, E21.665; 438/3, 48, 438/73; 365/171, 173, 158
See application file for complete search history.

(56) References Cited

U.S. PATENT DOCUMENTS

| | | | |
|---|---|---|---|
| 5,956,267 | A | 9/1999 | Hurst et al. |
| 6,413,788 | B1 * | 7/2002 | Tuttle ............................ 438/3 |
| 6,707,083 | B1 | 3/2004 | Hiner et al. |
| 6,885,074 | B2 | 4/2005 | Durlam et al. |
| 7,005,691 | B2 | 2/2006 | Odagawa et al. |
| 7,072,677 | B2 | 7/2006 | Kim et al. |
| 2003/0137028 | A1 | 7/2003 | Hosotani et al. |
| 2003/0137053 | A1 | 7/2003 | Okayama |
| 2004/0032010 | A1 | 2/2004 | Kools et al. |

OTHER PUBLICATIONS

Lenssen, K.-M.H., et al., "Magnetic Random Access Memory (MRAM) and its Prospects," 2001 Non-volatile Memory Technology Symposium Proceedings, 2001, 6 pp.
Reohr, W., et al., "Memories of Tomorrow," IEEE Circuits & Devices Magazine, Sep. 2002, pp. 17-27, IEEE, Los Alamitos, CA.
Durlam, M., et al., "A low power 1Mbit MRAM based on 1T1MTJ bit cell integrated with Copper Interconnects," 2002 Symposium on VLSI Circuits Digest of Technical Papers, 2002, pp. 158-161, IEEE, Los Alamitos, CA.

* cited by examiner

*Primary Examiner*—David Vu
(74) *Attorney, Agent, or Firm*—Slater & Matsil, L.L.P.

(57) ABSTRACT

Methods of forming ferromagnetic liners on the top surface and sidewalls of conductive lines of magnetic memory devices. The ferromagnetic liners increase the flux concentration of current run through the conductive lines, reducing the amount of write current needed to switch magnetic memory cells. In one embodiment, an in-bound pole is formed at the bottom edge of conductive lines, further concentrating the flux.

31 Claims, 6 Drawing Sheets

FERROMAGNETIC LINER FOR CONDUCTIVE LINES OF MAGNETIC MEMORY CELLS AND METHODS OF MANUFACTURING THEREOF

TECHNICAL FIELD

The present invention relates generally to the fabrication of semiconductor devices, and more particularly to the fabrication of magnetic memory devices.

BACKGROUND

Semiconductors are used in integrated circuits for electronic applications, including radios, televisions, cell phones, and personal computing devices, as examples. One type of semiconductor device is a semiconductor storage device, such as a dynamic random access memory (DRAM) and flash memory, which use a charge to store information.

A recent development in semiconductor memory devices involves spin electronics, which combines semiconductor technology and magnetics. The spin of electrons, rather than the charge, is used to indicate the presence of binary states "1" and "0." One such spin electronic device is a magnetic random access memory (MRAM) device, which includes conductive lines (wordlines and bitlines) positioned in different directions, e.g., perpendicular to one another in different metal layers, the conductive lines sandwiching a magnetic stack or magnetic tunnel junction (MTJ), which functions as a magnetic memory cell. A current flowing through one of the conductive lines generates a magnetic field around the conductive line and orients the magnetic polarity into a certain direction along the wire or conductive line. A current flowing through the other conductive line induces the magnetic field and can partially turn the magnetic polarity, also. Digital information, represented as a "0" or "1," is storable in the alignment of magnetic moments. The resistance of the magnetic memory cell depends on the moment's alignment. The stored state is read from the magnetic memory cell by detecting the resistive state of the MTJ.

MRAM devices are typically arranged in an array of rows and columns, and the wordlines and bitlines are activated to access each individual memory cell. In a cross-point MRAM array, current is run through the wordlines and bitlines to select a particular memory cell. In a field effect transistor (FET) array, each MTJ is disposed proximate a FET, and the FET for each MTJ is used to select a particular memory cell in the array. In a FET array, an electrode is typically formed between the MTJ and the FET to make electrical contact between the MTJ and the FET.

An advantage of MRAM devices compared to traditional semiconductor memory devices such as dynamic random access memory (DRAM) devices is that MRAM devices are non-volatile. For example, a personal computer (PC) utilizing MRAM devices would not have a long "boot-up" time as with conventional PCs that utilize DRAM devices. Also, an MRAM device does not need to be continually powered to "remember" the stored data. Therefore, it is expected that MRAM devices will replace flash memory, DRAM and static random access memory devices (SRAM) devices in electronic applications where a memory device is needed.

Because MRAM devices operate differently than traditional memory devices and because they are relatively new, they introduce design and manufacturing challenges.

SUMMARY OF THE INVENTION

Embodiments of the present invention achieve technical advantages by providing methods of forming ferromagnetic liners around wordlines or bitlines of an MRAM device.

In accordance with a preferred embodiment of the present invention, a method of fabricating a conductive line of a resistive memory device includes providing a workpiece having at least one resistive memory cell formed thereon, forming an insulating layer over the at least one resistive memory cell, and forming a trench in the insulating layer over the at least one resistive memory cell, the trench having sidewalls. A first liner is formed on the sidewalls of the trench, the first liner comprising a first ferromagnetic material. The trenches are filled with a conductive material, and a second liner is formed over at least the conductive material within the trench, the second liner comprising a second ferromagnetic material.

In accordance with another preferred embodiment of the present invention, a magnetic memory device includes a resistive memory element, a conductive line disposed over the resistive memory element, the second conductive line comprising a bottom surface, a top surface, and sidewalls, and a ferromagnetic liner disposed on the top surface, the sidewalls, and an edge portion of the bottom surface proximate the sidewalls of the conductive line.

Advantages of embodiments of the present invention include providing improved methods of forming ferromagnetic liners around conductive lines of MRAM devices. The write current and the power consumption of an MRAM device can be reduced in accordance with embodiments of the present invention. The ferromagnetic liners concentrate or focus the magnetic flux of current run through the conductive lines. In one embodiment, the flux concentration of conductive lines is further increased by the formation of in-bound poles of ferromagnetic material proximate the bottom edges of the conductive lines.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an MRAM device. Embodiments of the present invention may also be applied, however, to other magnetic devices, namely, magnetic memory devices, for example.

Figure 1:
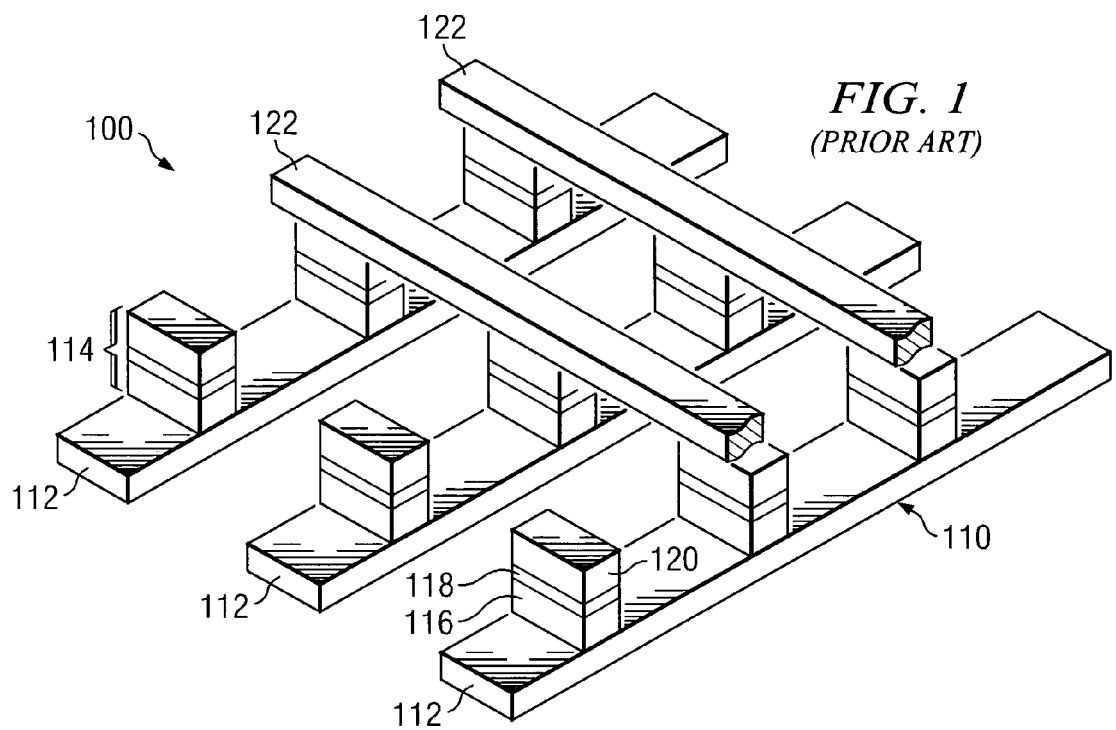
FIG. 1 illustrates a perspective view of a prior art MRAM array.

FIG. 1 illustrates a perspective view of a prior art crosspoint MRAM 100 device having bitlines 112 located substantially perpendicular to wordlines 122 in adjacent metallization layers. Magnetic stacks 114 are positioned between the bitlines 112 and wordlines 122 adjacent and electrically coupled to bitlines 112 and wordlines 122. The magnetic stacks 114 are also referred to herein as resistive memory elements, magnetic memory cells, or MTJ's.

A typical manufacturing process for the MRAM device 100 of FIG. 1 will next be described. A workpiece (not shown) is provided, typically comprising silicon oxide over silicon single-crystal silicon, for example. The workpiece may include other conductive layers or other semiconductor elements, e.g., transistors, diodes, etc. Compound semiconductors such as GaAs, InP, Si/Ge, and SiC may be used in place of silicon, for example.

A first inter-level dielectric layer (not shown) is deposited over the workpiece. The inter-level dielectric may comprise silicon dioxide, for example. The inter-level dielectric layer is patterned, for example, for vias, and etched. The vias may be filled with a metal such as copper, tungsten or other metals, for example.

A metallization layer, e.g., an M2 layer comprising aluminum, copper, or other conductive material, is formed next. If copper is used for the first conductive lines 112, typically a damascene process is used to form the first conductive lines 112. A dielectric, not shown, is deposited over interlevel dielectric layer and vias. The dielectric layer is patterned and etched, and the trenches are filled with conductive material to form the first conductive lines 112 in the M2 layer. Alternatively, the first conductive lines 112 may be formed using a subtractive etch process, and a dielectric material may be disposed between the first conductive lines 112.

Next, a magnetic stack 114 is formed over first conductive lines 112. The magnetic stack 114 typically comprises a first magnetic layer 116 including one or more magnetic layers. The first magnetic layer 116 may comprise a plurality of layers of materials such as PtMn, NiMn, IrMn, FeMn, CoFe, Ru, Al, and NiFe, as examples, although alternatively, other materials may be used for the first magnetic layer 116, for example. The first magnetic layer 116 is also referred to as a hard layer, a pinned layer, or a fixed layer because its magnetic orientation is fixed.

The magnetic stack 114 also includes a thin dielectric layer 118 comprising $Al_xO_y$, e.g., $Al_2O_3$, for example, deposited over the first magnetic layer 116, although alternatively, the dielectric layer 118 may comprise other insulating materials. The dielectric layer 118 is often referred to as a tunnel layer, tunnel junction, or barrier layer.

The magnetic stack 114 also includes a second magnetic layer 120 comprising similar materials as the first magnetic layer 116. The second magnetic layer 116 is often referred to as the soft layer or free layer because its magnetic orientation is changed depending on the desired logic state of the magnetic memory cell.

The first magnetic layer 116, dielectric layer 118 and second magnetic layer 120 are patterned to form a plurality of MTJ's 110, with each MTJ 110 being disposed over a first conductive line 112. The patterned magnetic stacks 114 or MTJ's 110 are typically substantially rectangular in shape, as shown, are alternatively may be other shapes, such as oval, as an example. The MTJ's 110 comprise resistive memory elements. The terms "MTJ," "resistive memory element," "resistive memory cell," "magnetic memory element," and "magnetic memory cell," are used interchangeably herein A plurality of second conductive lines 122 is formed over the MTJ's 110. The second conductive lines 122 may be formed within an M3 layer, for example, and are positioned in a different direction than the first conductive lines 112. If the second conductive lines 122 comprise copper, again, a damascene process is typically used to form them. A dielectric layer (not shown) is deposited over the MTJ's 110. The dielectric layer is patterned and etched with trenches that will be filled with a conductive material to form the second conductive lines 122. Alternatively, a non-damascene process may be used to form the first and second conductive lines 112 and 122. Conductive lines 112 and 122 may function as the wordlines and bitlines, respectively, of the MRAM array 100, as examples.

The order of the magnetic stack 114 layers may be reversed, e.g., the pinned layer 116 may be on the top of or above the insulating layer 118, and the free layer 120 may be on the bottom of or below the insulating layer 118. Similarly, the wordlines 112 and bitlines 122 may be disposed either above or below the magnetic stack layers 114.

In MRAM devices, information is stored in the free layer 120 of the MTJ's 110. To store the information, the magnetization of one ferromagnetic layer or information layer, e.g., the free layer 120, is aligned either parallel or antiparallel to a second magnetic layer or reference layer, e.g., the pinned layer 116. The information is detectable due to the fact that the resistance of a parallel element is different than an anti-parallel element. Switching from a parallel to an anti-parallel state, and vice versa, may be accomplished by running current, often referred to as the switching current or write current, through both conductive lines 112 and 122, and from the pinned layer 116 to the free layer 120, or vice versa. The switching current induces a magnetic field at the location of the MTJ memory element 110 large enough to change the magnetization of the information layer or free layer 120. Tunneling current is current run through the element that is used for reading the resistive state.

A problem with MRAM devices is that when write current is run through the conductive lines 122 which comprise bitlines, for example, if the magnetic flux induced by the write current is not strong enough, a large amount of current may be required to switch the magnetic polarity of the MTJ memory element 110. Therefore, what is needed in the art is a method of focusing or concentrating the magnetic flux of conductive lines that are used to conduct write current for an MRAM device.

Embodiments of the present invention derive technical advantages by providing a magnetic memory cell structure having a ferromagnetic material liner disposed around the top conductive lines disposed over a magnetic memory cell. Several novel methods of forming the ferromagnetic liner are disclosed herein. The ferromagnetic liner functions as a barrier layer and also a flux concentrator.

Figure 2:
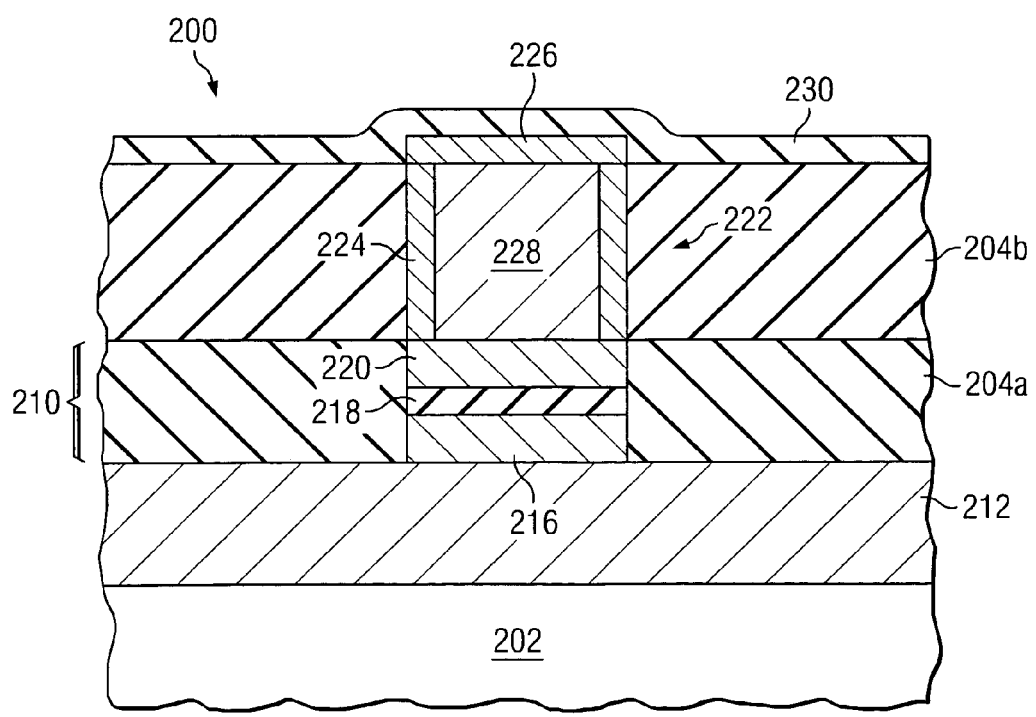
FIG. 2 shows a cross-sectional view of a MRAM device having a ferromagnetic liner on the sidewalls and the top surface of a conductive line over a magnetic memory cell in accordance with an embodiment of the present invention.

FIG. 2 illustrates a general overview of embodiments of the present invention. FIG. 2 shows a cross-sectional view of an MRAM device 200 having a ferromagnetic liner 224/226 on sidewalls (first liner 224) and the top surface (second liner 226) of a conductive line 222 over a magnetic memory cell 210 in accordance with an embodiment of the present invention. Like numerals are used for the various elements in FIG. 2 as were described with reference to FIG. 1. To avoid repetition, each reference number shown in the diagram may not necessarily be described again in detail herein. Rather, similar materials x16, x18, x20, etc. are preferably used for the material layers shown as were described for FIG. 1, where x=1 in FIG. 1 and x=2 in FIG. 2.

In the cross-sectional view shown in FIG. 2, a first conductive line 212 is formed over a workpiece 202. An MTJ 210 is formed over the first conductive line 212. The MTJ 210 may be one of a plurality of MTJ's 210 formed in an MRAM array, such as the one shown in FIG. 1, for example. The MTJ 210 is isolated electrically from other MTJ's (not shown) by an insulating layer 204a. A second conductive line 222 comprising a conductive material 228 is formed over the MTJ 210.

The first liner 224 and the second liner 226 preferably comprise a ferromagnetic material, such as NiFe, CoFe, CoFeB, CoWP, other alloys of Ni, Fe, Co, or combinations thereof, as examples. Alternatively, the first liner 224 and the second liner 226 may comprise other ferromagnetic materials, for example. The first liner 224 and the second liner 226 preferably comprise a thickness of about 400 Angstroms or less. The first liner 224 and the second liner 226 may comprise the same material, although alternatively, the first liner 224 and the second liner 226 may comprise different materials, for example. The first liner 224 and the second liner 226 together form the shape of an upside-down letter U in the cross-section of the device 200 around the second conductive line 222, for example. Diffusion barriers may be disposed above and/or below the first and second liners 224 and 226 and conductive material 228, and a seed layer may be disposed below the first and second liners 224 and 226 and conductive material 228, to be described further herein.

The second conductive line 222 is electrically isolated from other second conductive lines (not shown) by insulating layer 204b. In accordance with preferred embodiments of the present invention, the second conductive line 222 is formed using a damascene process. Vias and other conductive structures may be formed simultaneously or in a separate lithography step within the same insulating layer 204b (not shown). The second conductive lines 222 may be covered with an encapsulating layer 230. The encapsulating layer 230 comprises a dielectric material and may be patterned in subsequent manufacturing steps to make electrical contact to the second conductive line 222, for example (not shown).

FIGS. 3A through 3D and 4 through 6 show cross-sectional views of methods of forming a ferromagnetic liner on sidewalls of conductive lines of a magnetic memory device in accordance with preferred embodiments of the present invention. Only one MTJ 310 is shown in each figure; however, there may be a plurality of MTJ's 310 and conductive lines formed on a single device 300.

Note that like numerals are used for the various elements in FIGS. 3A-3D, 4-6 and 7A-7D as were described with reference to FIGS. 1 and 2. To avoid repetition, each reference number shown in the diagram may not necessarily be described again in detail herein. Rather, similar materials x16, x18, x20, etc. are preferably used for the material layers shown as were described for FIG. 1, where x=1 in FIG. 1, x=2 in FIG. 2, and x=3 in FIGS. 3A-3D, 4-6 and 7A-7D.

Figure 3A:
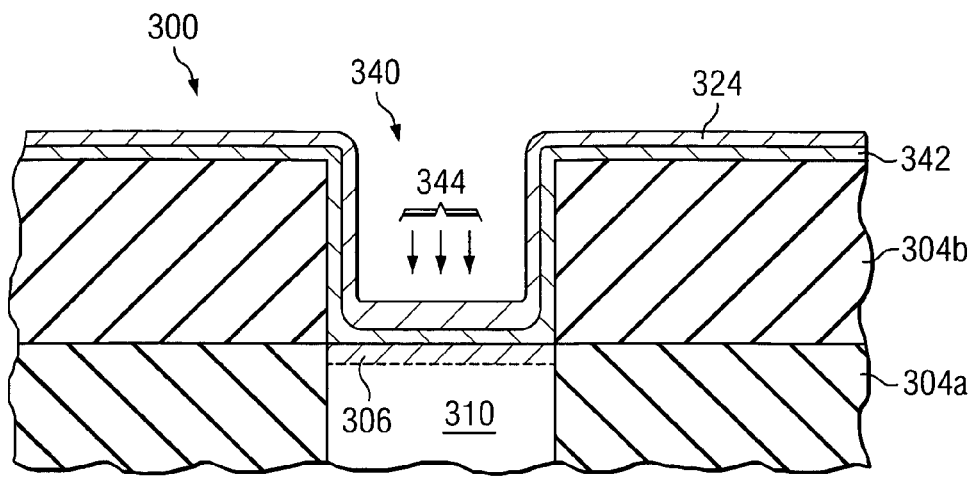
FIGS. 3A through 3D and 4 through 6 show cross-sectional views of methods of forming a ferromagnetic liner on sidewalls of conductive lines of a magnetic memory device in accordance with preferred embodiments of the present invention.

Referring to FIG. 3A, first, a workpiece or semiconductor substrate (not shown in FIG. 3A; see FIG. 2) is provided. The workpiece includes at least one resistive memory cell or MTJ 310 formed thereon (e.g., formed over a conductive line as shown in FIG. 2). The resistive memory cell 310 may include a hard mask 306 comprising a conductive material at the top surface thereof, as shown in phantom. An insulating layer 304b is formed over the at least one resistive memory cell 310 and insulating layer 304a between the resistive memory cells 310. A trench 340 for each conductive line is formed in the insulating layer 304b over the at least one resistive memory cell 310. The trench 340 has sidewalls and a bottom surface.

In accordance with one embodiment of the present invention, an optional liner 342 may be formed over the trench 340. The liner 342 is substantially conformal and is deposited over the top surface of the insulating layer 304b, the sidewalls of the trench 340 and the bottom surface of the trench 340, as shown. The liner 342 preferably functions as a diffusion barrier and may comprise Ta, TaN, WN, TiN, multiple layers thereof, or combinations thereof, deposited in a thickness of about 300 Angstroms or less, although alternatively, the liner 342 may comprise other materials and dimensions, for example. If a subsequently deposited first ferromagnetic liner 324 comprises NiFe, for example, preferably liner 342 comprises a nitride material, because NiFe adheres well to nitrides.

Next, a first ferromagnetic liner 324 is deposited over liner 342, as shown in FIG. 3A. Liner 324 preferably comprises about 400 Angstroms or less of a first ferromagnetic material, such as Ni, Fe, Co, alloys thereof, or combinations thereof, although alternatively, the liner 324 may comprise other materials and dimensions. The liner 324 may comprise NiFe, CoFe, CoFeB, CoWP, CoNi, NiFeCo, other soft magnetic materials, or combinations thereof, as examples. If the ferromagnetic liner 324 comprises NiFe, preferably a liner 342 is included as a diffusion barrier, for example. However, if a Co alloy is used for the ferromagnetic liner 324, a liner 342 may not be required.

Figure 4:
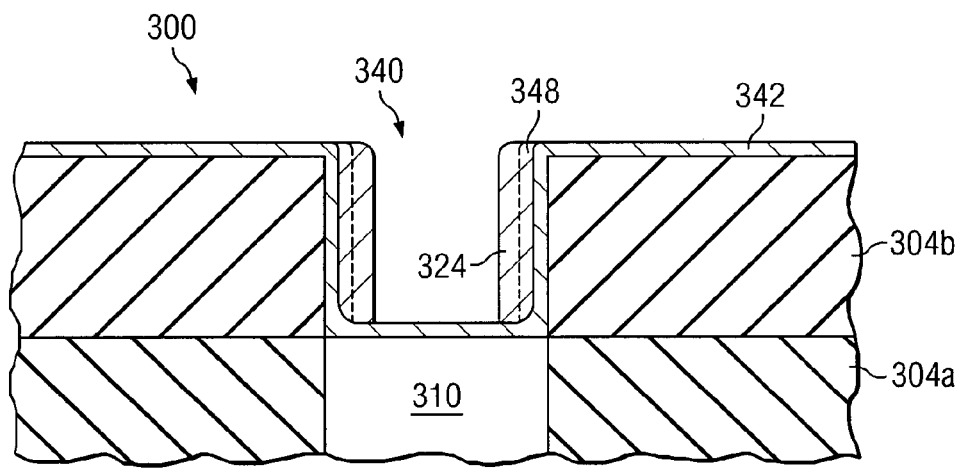

In one embodiment, an anisotropic etch 344 process is then used to remove the ferromagnetic liner 324 from the bottom surface of the trench 340, leaving the ferromagnetic liner 324 disposed over the sidewalls of the trench 340, as shown in FIG. 4. Preferably, the anisotropic etch 344 comprises a directional sputter etch that removes the liner 324 from the bottom surface of the trench 340 and also redeposits some of the liner 324 material onto the sidewalls, increasing the thickness of the liner 324 on the sidewalls of the trench 340. The anisotropic etch 344 may comprise a directional sputter etch, although the anisotropic etch 344 may alternatively comprise other etch processes, for example.

In one embodiment, the ferromagnetic liner 324 is deposited over the barrier liner 342 using a physical vapor deposition (PVD) process. PVD deposition has a tendency to deposit more material (e.g., twice as much) over the bottom surface of a trench 340 than on the sidewalls, for example, as shown in FIG. 3A. Therefore, in this embodiment, the anisotropic etch to remove the liner 324 from the bottom surface of the trench 340 may be required to be lengthened to ensure that all of the liner 324 is removed from the bottom surface of the trench 340.

Figure 3B:
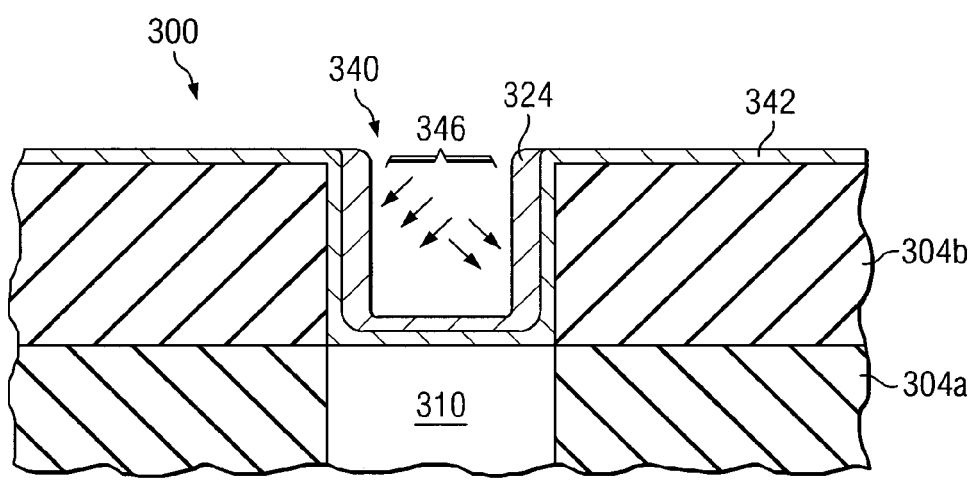

In another embodiment, the ferromagnetic liner 324 is deposited over the barrier liner 342 using an ion beam deposition (IBD) process 346, as shown in FIG. 3B. Preferably, the ion beam deposition 346 comprises a directional deposition at a relatively substantially flat angle, so that more material is deposited onto the trench 340 sidewalls than on the bottom surface of the trench 340, as shown. This embodiment is advantageous because there is less material deposited on the bottom surface of the trench 340, making it easier to remove the ferromagnetic liner 324 from the trench 340 bottom surface.

Figure 3C:
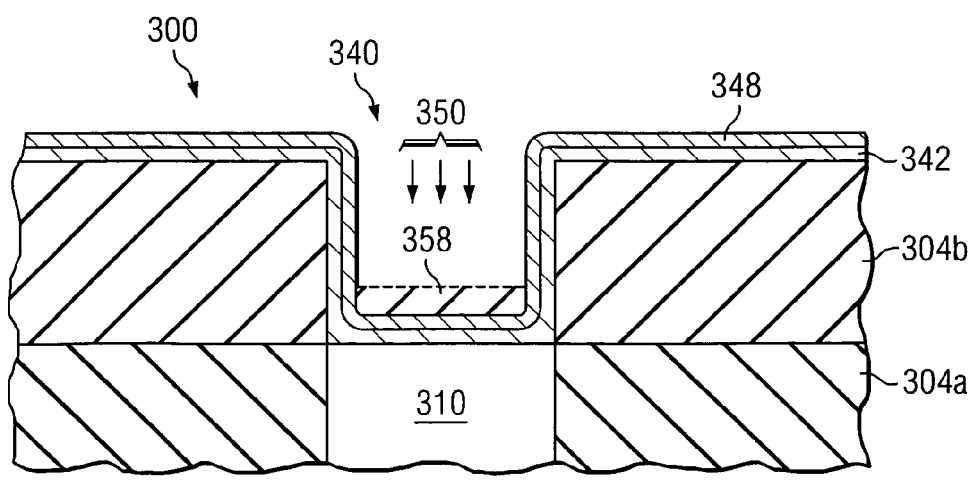
Figure 3D:
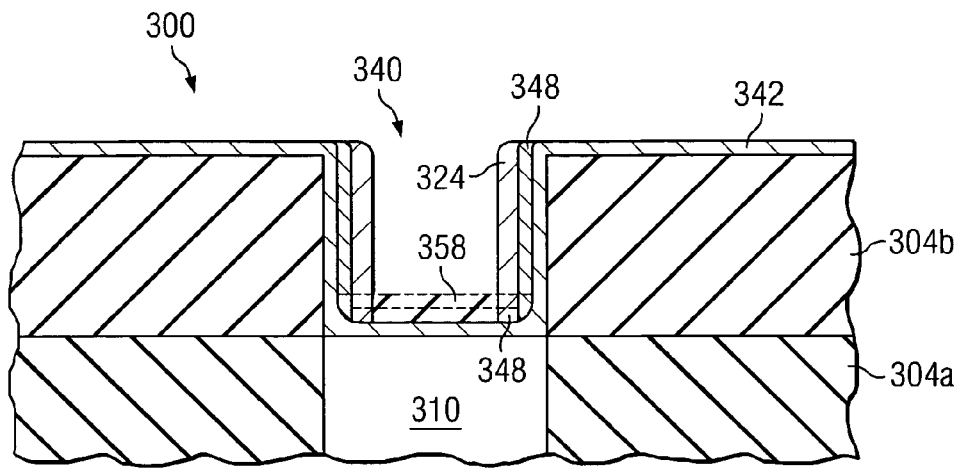

In another embodiment, shown in FIGS. 3C and 3D, a thin seed layer 348 is deposited over the barrier liner 342, before the ferromagnetic liner 324 is formed. The seed layer 348 preferably comprises about 20 nm or less of a metal, as an example, although alternatively, the seed layer 348 may comprise other dimensions. The seed layer 348 may comprise Cu, Cr, Ni, NiFeCr, a magnetic material, or other materials, as examples, although alternatively, the seed layer 348 may comprise other materials. The seed layer 348 is anisotropically etched (350), e.g., using a sputter etch, for example, to remove the seed layer 348 from the bottom surface of the trench 340, leaving the structure shown in FIG. 3D.

The ferromagnetic liner 324 is then selectively formed over the seed layer 348 on the sidewalls of the trench 340. For example, the ferromagnetic liner 324 may be formed using electroless plating or other plating techniques. This embodiment is advantageous because an etch process is not required to remove the ferromagnetic liner 324 from the bottom surface of the trench 340, for example.

In yet another embodiment, the bottom surface of the trench is protected by a material (358, shown in phantom in FIGS. 3C and 3D) while the ferromagnetic liner 324 is selectively deposited over the sidewalls of the trench 340. In this embodiment, the seed layer 348 may be left remaining on the bottom surface of the trench, as shown in phantom in FIG. 3D. For example, after forming the barrier liner 342 and seed layer 348, a material 358 comprising an oxide-forming material may be formed over the bottom surface of the trench. The oxide-forming material 358 preferably comprises a material that sputter etches easily and that does not dissolve and that is stabile in a plating bath, for example. The oxide-forming material 358 may comprise about 10 nm or less of Ta, TaN, SiN, SiO$_2$, or other nitride or oxide materials, as examples, although alternatively, the oxide-forming material 358 may comprise other materials and dimensions, for example. The oxide-forming material 358 preferably is deposited using a directional deposition technique, such as PVD with a high target substrate distance, for example, so that the trench 340 bottom surface is covered, but not the trench 340 sidewalls. Because the ferromagnetic liner 324 will not plate onto an oxide surface, the ferromagnetic liner 324 may then be selectively plated onto the seed layer 348 on the sidewalls of the trench 340, leaving the structure shown in FIG. 3D. The oxide-forming material 358 is then removed from the bottom surface of the trench 340.

In another embodiment, the trench bottom surface is prevented from being plated by spinning on a thin film 358 comprising an organic material over the seed layer 348. The organic material 358 preferably comprises a material that can evaporate or ionize, and that can be sputtered on in a directional deposition technique such as IBD. The organic material 358 may comprise about 10 nm of pentazene, although the organic material 358 may comprise other dimensions and many other types of directionally deposited materials, for example. The organic material 358 flows into the trench 340 bottom, so that the organic material 358 is thicker over the trench 340 bottom surface than on the sidewalls. The organic material 358 is then removed from the sidewalls of the trench 340, for example, using an isotropic etch, e.g., using hydrogen plasma or CO/NH$_3$ plasma, as examples. Preferably, the etch process for the organic material 358 is a timed etch and does not oxidize the seed layer 348.

Because the ferromagnetic liner 324 material will not plate onto an organic material 358, the ferromagnetic liner 324 may then be selectively plated onto the seed layer 348 on the sidewalls of the trench 340, leaving the structure shown in FIG. 3D. The organic material 358 is then removed from the bottom surface of the trench 340.

Note that in the embodiments wherein the trench 340 bottom surface is blocked with material 358 during the plating or formation of the ferromagnetic liner 324, preferably the seed layer 348 comprises a non-magnetic material such as Cu or Cr, as examples.

Figure 5:
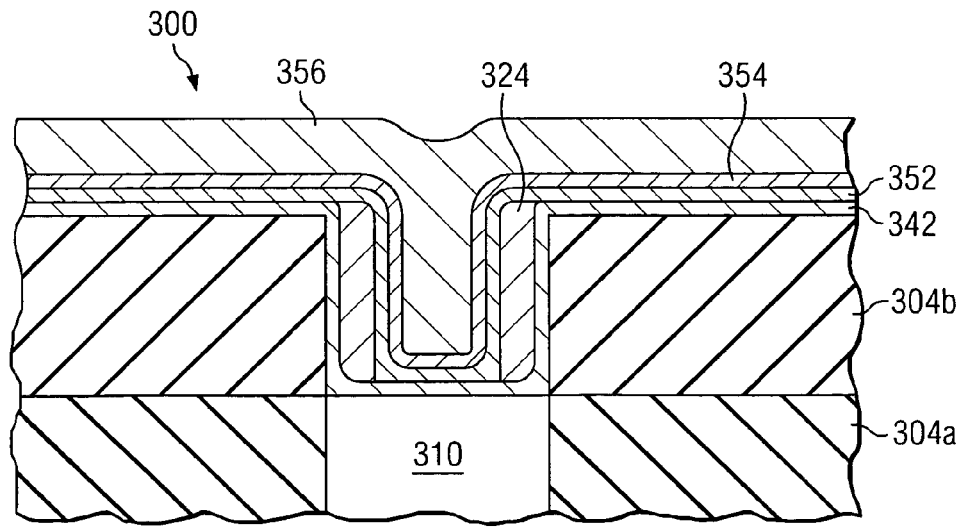
Figure 6:
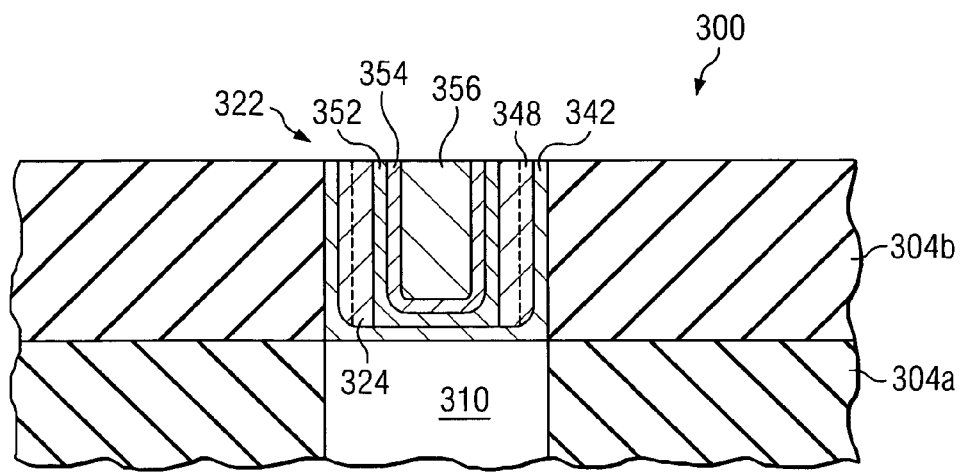

After the ferromagnetic liner 324 is formed over the sidewalls of the trench 340 using the methods described herein, the trench 340 is filled with a conductive material 356, such as Cu, Ag, or other conductive materials and combinations thereof, as shown in FIG. 5. The device 300 is then etched or chemically-mechanically polished (CMP) to remove excess conductive material 356 from the top surface of insulating layer 304$b$, as shown in FIG. 6. The conductive material 356 may alternatively comprise other conductive materials, for example.

Before the conductive material 356 is deposited over the trench 340, an optional liner or barrier layer 352 may be deposited over the ferromagnetic liner 324 on the sidewalls and over the liner 342 on the bottom surface of the trench 340, as shown in FIG. 5. The barrier layer 352 preferably comprises about 300 Angstroms or less of Ta, TaN, WN, TiN, multiple layers thereof, or combinations thereof, for example. The barrier layer 352 may alternatively comprise other materials and dimensions, for example. If the barrier layer 352 comprises multiple layers, preferably, the surface of the barrier layer that faces and abuts the conductive material 356 does not comprise a nitride material, in one embodiment.

An optional seed layer 354 may be deposited over the barrier layer 352, as shown. The seed layer 354 preferably comprises about 900 Angstroms or less of Cu or Ag, for example, although alternatively, the seed layer 354 may comprise other materials and dimensions. The seed layer 354 preferably comprises the same material as the conductive fill material 356, for example. The conductive material

356 may be formed by plating the conductive material 356 using the seed layer 354 as a seed, for example.

During the etch or CMP process to remove excess conductive material 356 from the top surface of the insulating layer 304b, preferably excess seed layer 354 and barrier layers 342 and 352 are also removed from over the insulating layer 304b, as shown in FIG. 6. The conductive line 322 includes a ferromagnetic liner 324 formed over the sidewalls of the conductive line 322 at this stage of the manufacturing process. Note that if the seed layer 348 shown in FIGS. 3C and 3D was left remaining at the bottom of the trench, the seed layer 348 would be present in the structure, disposed over barrier layer 342 (not shown).

Next, a second ferromagnetic liner 326 is formed over the top surface of the conductive line 322, to be described with reference to FIGS. 7A through 7D. FIGS. 7A through 7D show cross-sectional view of methods of forming ferromagnetic liners on the top surface of conductive lines of a magnetic memory device in accordance with preferred embodiments of the present invention.

Figure 7A:
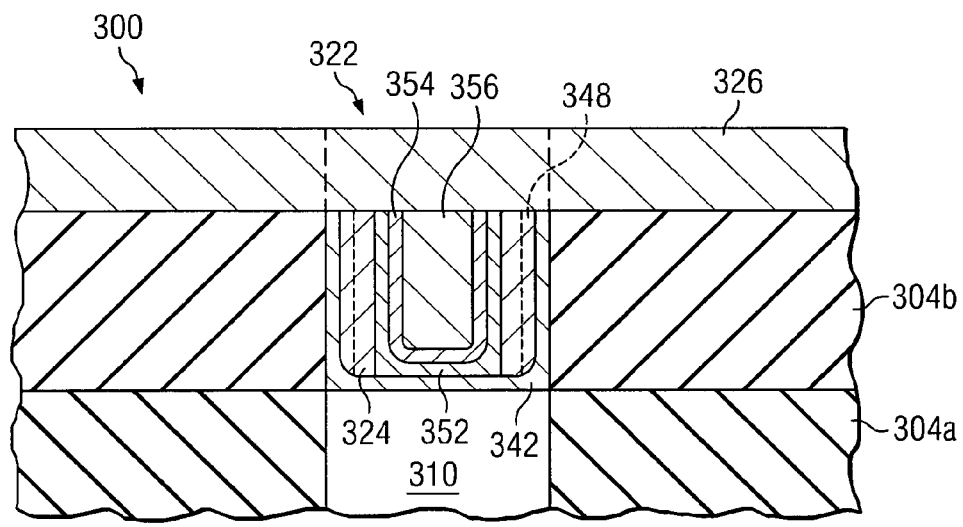
FIGS. 7A through 7D show cross-sectional view of methods of forming ferromagnetic liners on the top surface of conductive lines of a magnetic memory device in accordance with preferred embodiments of the present invention.

In one embodiment, the second ferromagnetic liner 326 is formed by depositing the ferromagnetic liner 326 material over the entire top surface of the conductive line 322 and the insulating layer 304b, as shown in FIG. 7A. The liner 326 preferably comprises a second ferromagnetic material. The second ferromagnetic material of the liner 326 preferably comprises about 400 Angstroms or less of Ni, Fe, Co, alloys thereof, or combinations thereof, for example, although alternatively, the liner 326 may comprise other materials and dimensions. The liner 326 may comprise NiFe, CoFe, CoFeB, CoWP, CoNi, NiFeCo, other soft magnetic materials, or combinations thereof, as examples. The second ferromagnetic liner 326 may comprise the same material as the first ferromagnetic liner 324, or alternatively, the liner 326 may comprise a different material than the material of liner 324, for example.

Figure 7B:
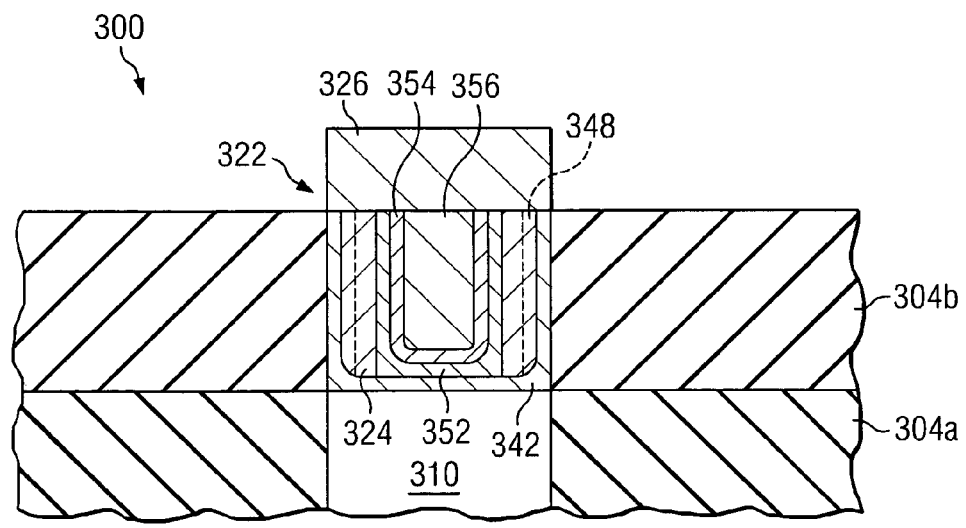

The second ferromagnetic liner 326 is then patterned using lithography techniques, and the liner 326 is etched to remove the liner 326 material from over the top surface of the insulating layer 304b, as shown in FIG. 7B. Advantageously, the same mask or mask pattern that is used to form trenches 340 may be used to pattern the second ferromagnetic liner 326. For example, a reverse resist may be used. Alternatively, an inverted mask may be used, for example. In this embodiment, the liner 326 may be deposited using PVD, for example, although alternatively, other deposition methods may be used. An oxide mask may be used as a hard mask (not shown), for example, rather than a resist, to pattern the liner 326. The hard mask may be left remaining on the device 300 as part of a subsequently formed inter-level dielectric (ILD) layer, for example.

In another embodiment, the second ferromagnetic liner 326 may be selectively plated onto the top of the conductive line 322, leaving the structure shown in FIG. 7B. In this embodiment, preferably, an electroless deposition or other plating technique is used. Preferably, a seeding step is timed so as to avoid etching the upper parts of the first ferromagnetic liner 324. Preferably, there is good flux closure between liner 326 and liner 324; e.g., preferably, liner 326 is formed over at least a portion of liner 324 on the trench sidewalls. In another embodiment, the liner 326 preferably is formed over substantially all of liner 324, for example, as shown in FIG. 7B.

Figure 7C:
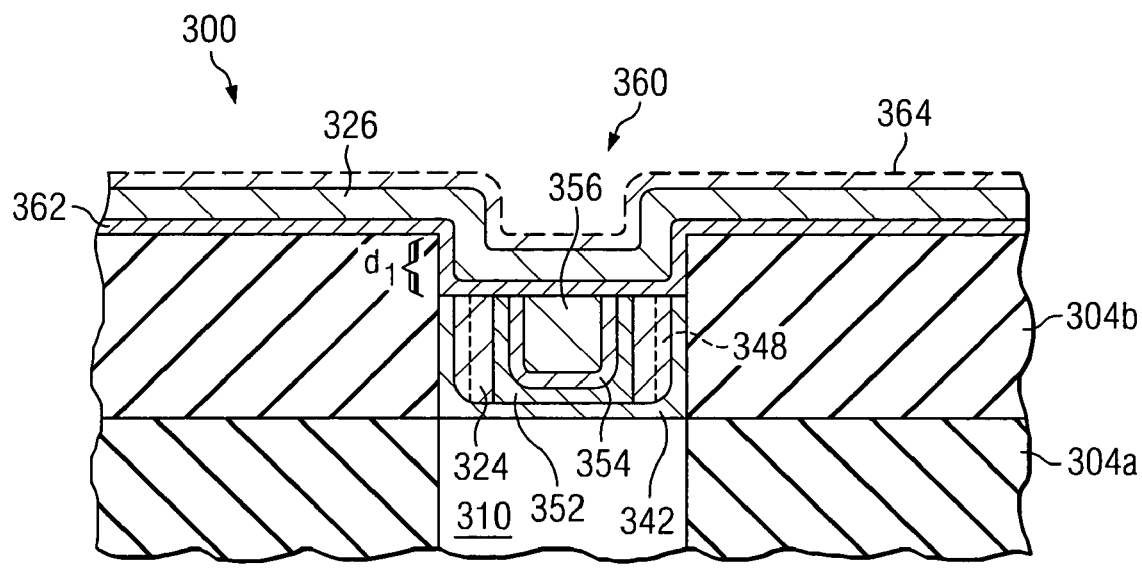

In another embodiment, the materials within the trench 340 are recessed to a predetermined depth $d_1$ beneath the top surface of the insulating layer 304b before forming the second ferromagnetic liner 326, as shown in FIG. 7C. The depth $d_1$ of the recess may be about 1000 Angstroms or less, for example. The depth $d_1$ of the recess is preferably at least as deep as the overall thickness of the second ferromagnetic liner 326 and the optional barrier layers 362 and 364, in one embodiment (to be described further herein). The conductive material 356, first ferromagnetic liner 324 and optional layers 342, 348 (shown in phantom), 352 and 354 are preferably recessed, as shown. The conductive line 322 materials may be recessed using a RIE with $CO/NH_3$ plasma or other etch processes, for example.

An optional barrier layer 362 may be deposited over the recessed conductive line 322 and the top surface of the insulating layer 304b, as shown in FIG. 7C. The barrier layer 362 may comprise about 300 Angstroms or less of Ta, TaN, WN, TiN, multiple layers thereof, or combinations thereof, for example, although alternatively, the barrier layer 362 may comprise other materials and dimensions. The liner 326 is deposited over the optional barrier layer 362, as shown, or directly over the recess and top surface of the insulating layer 304b, if a barrier layer 362 is not used.

An optional barrier layer 364 may be deposited over the second ferromagnetic liner 326, also shown in FIG. 7C in phantom. The barrier layer 364 may comprise about 300 Angstroms or less of Ta, TaN, WN, TiN, multiple layers thereof, or combinations thereof, for example, although alternatively, the barrier layer 364 may comprise other materials and dimensions.

Figure 7D:
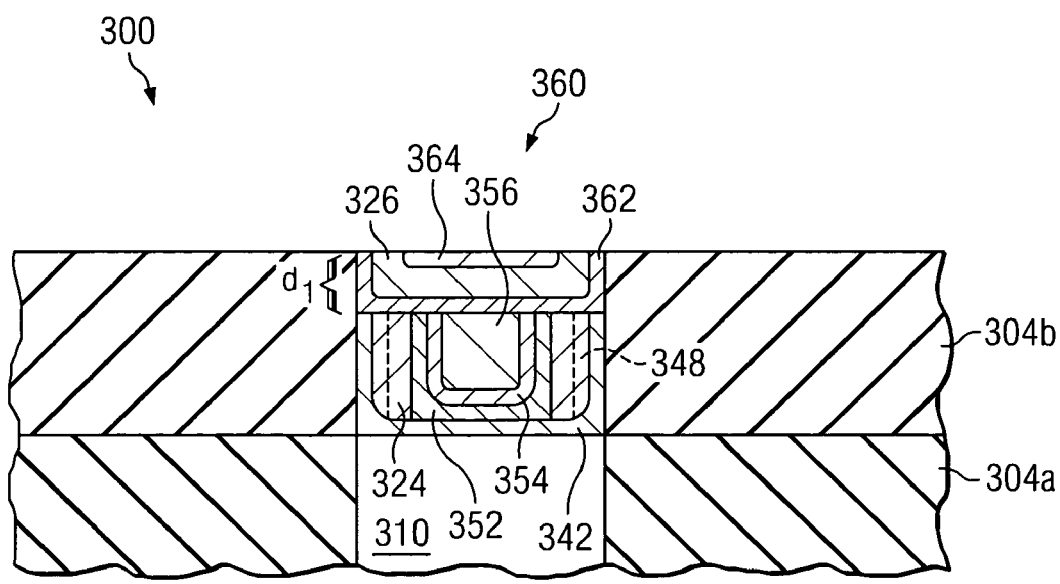

A CMP process is then used to remove the optional barrier layers 362 and 364 and second ferromagnetic liner 326 from the top surface of the insulating layer 304b, as shown in FIG. 7D. The optional barrier layers 362 and 364 and second ferromagnetic liner 326 are left remaining in the recess. Note that in this embodiment, the trenches 340 (see FIG. 4) may be made deeper to compensate for the loss of the conductive material 356 caused by the recess, for example.

It is important that the ferromagnetic material of liner 326 should be stable under the conditions of the CMP process. The optional second barrier layer 364 protects the second ferromagnetic liner 326 during the CMP process. If the liner 326 comprises a Co alloy, a bottom barrier layer 362 is not required.

The manufacturing processing of the device 300 is then continued. For example, the second ferromagnetic liner 326 may be encapsulated with a non-conductive diffusion barrier such as a Si:C:H based CVD material or other dielectric material.

Other conductive structures such as vias may be formed in the insulating layers 304b and 304a. For example, vias (not shown) to underlying metal levels may be formed after the trench 340 (see FIG. 4) formation, and the vias may be filled with the same materials the trench 340 is filled with. At the site of the vias, flux concentration is not necessary, but the magnetic materials of the liners 324 and 326 do not deleteriously impact the electrical performance of the vias.

Figure 8:
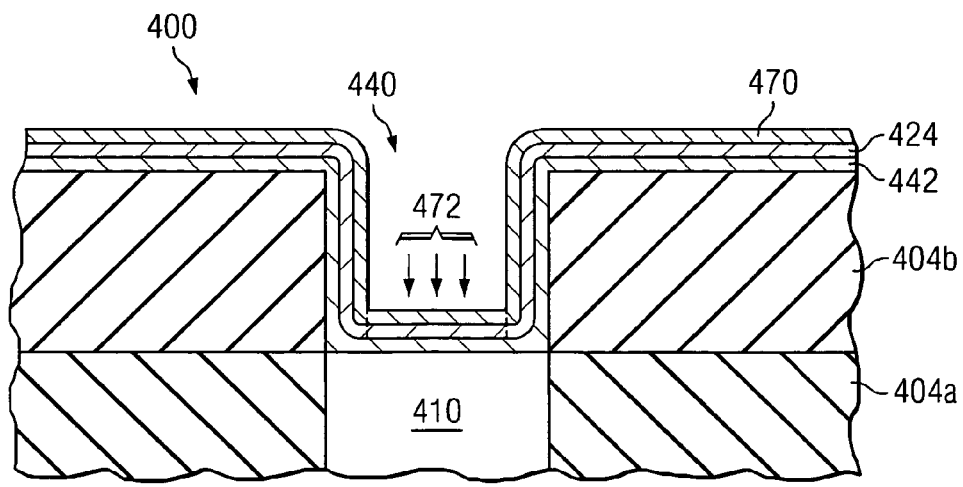
FIGS. 8 through 10 show another preferred embodiment of forming a ferromagnetic liner on sidewalls of conductive lines of a magnetic memory device, further including inbound poles formed proximate the outer bottom edge of the conductive lines.
Figure 9:
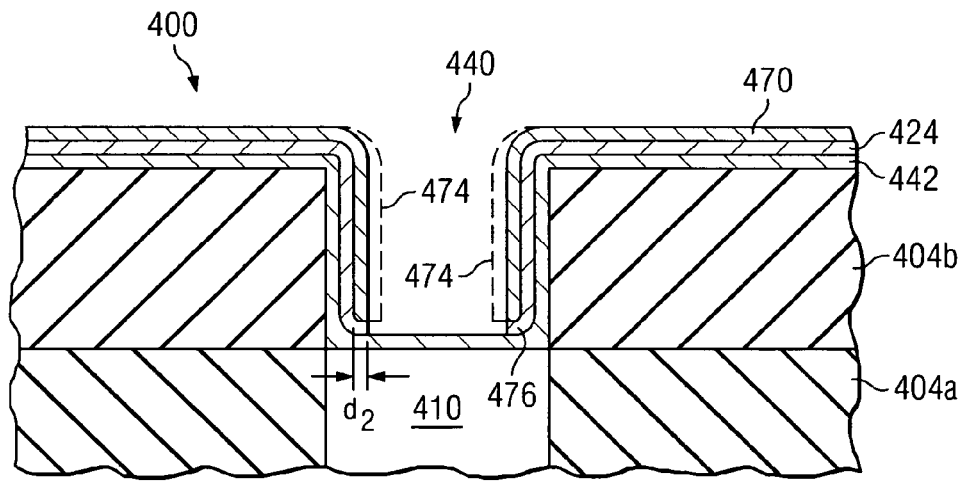
Figure 10:
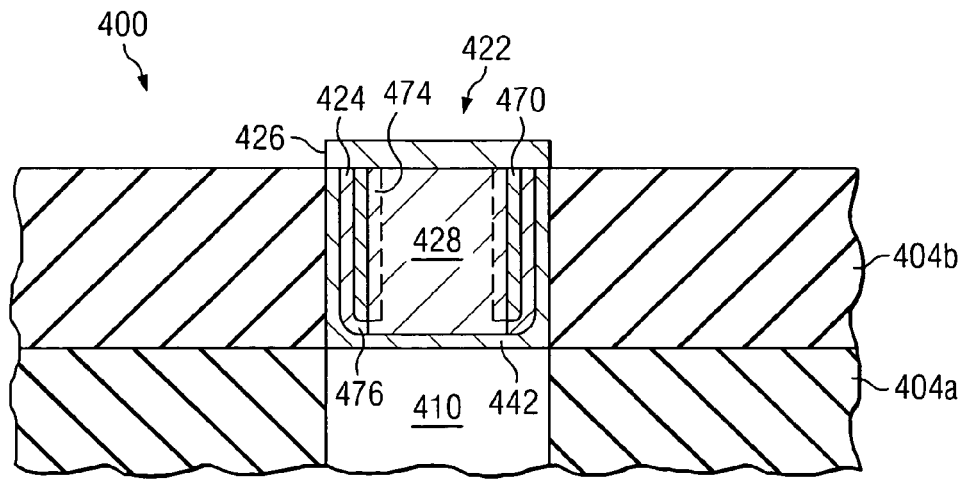

FIGS. 8 through 10 show another preferred embodiment of forming a ferromagnetic liner 424 on sidewalls of conductive lines of a magnetic memory device. Again, like numerals are used for the various elements in FIGS. 8-10 as were described with reference to FIGS. 1, 2, 3A-3D, 4-6 and 7A-7D. To avoid repetition, each reference number shown in the diagram may not necessarily be described again in detail herein. Rather, similar materials x16, x18, x20, etc. are preferably used for the material layers shown as were described for FIG. 1, where x=1 in FIG. 1, x=2 in FIG. 2, x=3 in FIGS. 3A-3D, 4-6 and 7A-7D, and x=4 in FIGS. 8-10.

In this embodiment, in-bound poles 476 comprised of the first ferromagnetic liner 424, as shown in FIG. 9, are formed using a masking spacer 470. The in-bound poles 476 further increase the field enhancement by closing inwardly towards the conductive line 422 the downwardly pointing tips of the U-shaped ferromagnetic liner formed by the second ferromagnetic liner 426 and the first ferromagnetic liner 424, forming a substantially horseshoe-shaped ferromagnetic liner 424/426 around the conductive line 422.

In this embodiment, an optional barrier layer 442 may be formed over the trenches 440, as shown in FIG. 8. The first ferromagnetic liner 424 is formed over the barrier layer 442, as shown. Next, a conformal conductive material 470 is formed over the ferromagnetic liner 424. The conformal conductive material 470 preferably comprises about 1000 Angstroms or less of Cu, TiN, W, TaN, or Nb, although alternatively, the conformal conductive material 470 may alternatively comprise other materials and dimensions, for example. The conformal conductive material 470 may be deposited using metal oxide chemical vapor deposition (MOCVD), IBD at a low angle to deposit more material on the sidewalls than on the bottom, or other CVD process, for example, although alternatively, other deposition techniques may be used.

The conformal conductive material 470 and the ferromagnetic liner 424 are anisotropically etched (472 in FIG. 8) to remove the conformal conductive material 470 and the ferromagnetic liner 424 from the bottom surface of the trench 440, as shown in FIG. 9. The anisotropic etch 474 of the conformal conductive material 470 and the ferromagnetic liner 424 may comprise a directional RWE, for example, and may comprise CO/NH$_3$ plasma adapted to selectively stop on the barrier material 442, as an example. All or portions of the conformal conductive material 470 and the ferromagnetic liner 424 may also be removed from the top surface of the insulating layer 404b during the anisotropic etch 474 (not shown).

A portion 476 of the first ferromagnetic liner 424 remains residing under the conformal conductive material 470, forming an in-bound pole 476 of ferromagnetic material proximate and abutting the bottom edge of the subsequently deposited or formed (e.g., plated) conductive material 428 on each side of the conductive line 422, as shown in FIG. 10. The in-bound pole 475 further enhances the magnetic flux that is induced when current is run through the conductive line 422. The portion 476 of the ferromagnetic liner 424 that resides under the conformal conductive material 470 may comprise a dimension d$_2$ (as shown in FIG. 9). Dimension d$_2$ may comprise about 1000 Angstroms or less, for example, and is preferably substantially the same as the thickness of the conformal conductive material 470.

Note that the anisotropic etch 472 (see FIG. 8) of the first liner 424 may further comprise forming a portion 474 of the first ferromagnetic liner 424 material on the conformal conductive material 470 on sidewalls of the trench 440 over the conformal conductive material 470, as shown in phantom in FIG. 9, and also shown in FIG. 10. This redeposited ferromagnetic material 474 does not negatively impact the flux concentration effect of the ferromagnetic liner 424. If a wet etch or RIE process is used for the anisotropic etch 472 (see FIG. 8) of the first ferromagnetic liner 424, the formation of the redeposited ferromagnetic material 474 may be avoided.

The conductive line 422 having a first ferromagnetic liner 424 with in-bound poles 476 is then capped with a second ferromagnetic liner 426 using one of the methods described and shown in FIGS. 7A-7D. The substantially horseshoe shaped ferromagnetic liner 424/426 including in-bound poles 476 advantageously cages in the magnetic flux of the conductive line 422 and further focuses and concentrates the magnetic flux of current run through the conductive line 422.

In another embodiment, the masking layer 470 may comprise a conformal insulating material, as shown in FIG. 8. As with the conformal conductive material 470, the conformal insulating material and ferromagnetic liner 424 are anisotropically etched to remove them from the bottom surface of the trench, as shown in FIG. 9. In this embodiment, the conformal insulating material is removed (not shown in the Figures) before forming a liner and conductive material for the conductive line, as shown in FIG. 5 (and also in FIG. 10). The conformal insulating material preferably comprises an amorphous carbon hydrogen (a-C:H) material deposited in a thickness of about 1000 Angstroms or less. An amorphous carbon hydrogen may be etched selectively using a hydrogen plasma with respect to the ferromagnetic liner 424 and the insulating layer 404b, for example. Advantageously, an in-bound pole 476 is formed at the lower corners of the conductive line 422 in this embodiment.

Advantages of embodiments of the invention include providing methods of increasing the flux concentration of conductive lines 222, 322 and 422 of magnetic memory devices 200, 300, and 400 by forming ferromagnetic liners 224, 324, 444, 226, 326 and 426 on the sidewalls and top surfaces of the conductive lines 222, 322 and 422. Several preferred methods of forming the liners 224, 324, 444, 226, 326 and 426 have been described herein. Because the magnetic flux is concentrated, the write current for magnetic memory cells 210, 310, and 410 may be decreased in accordance with embodiments of the present invention, decreasing the power consumption for the memory devices 200, 300, and 400, for example. In one embodiment, flux concentration of a conductive line 422 is further increased by the formation of in-bound poles 476 proximate the bottom edges of the conductive line 422.

Embodiments of the present application are advantageous when implemented in any resistive memory device, including MRAM devices 200, 300, and 400, for example. Embodiments of the invention may be implemented in cross-point MRAM arrays and FET MRAM arrays, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a conductive line of a resistive memory device, the method comprising:
   providing a workpiece having at least one resistive memory cell formed thereon;
   forming an insulating layer over the at least one resistive memory cell;
   forming a trench in the insulating layer over the at least one resistive memory cell, the trench having a bottom surface and sidewalls;
   depositing a seed layer over the bottom surface and over the sidewalls of the trench;
   selectively forming a first liner over the seed layer on the sidewalls of the trench, the first liner comprising a first ferromagnetic material;
   filling the trench with a conductive material; and
   forming a second liner over at least the conductive material within the trench, the second liner comprising a second ferromagnetic material.

2. The method according to claim 1, further comprising forming a third liner on the sidewalls and bottom surface of the trench, before forming the seed layer, and forming the seed layer on the third liner.

3. The method according to claim 2, wherein forming the third liner comprises forming Ta, TaN, WN, TiN, or combinations thereof.

4. The method according to claim 2, wherein forming the first liner comprises forming Ni, Fe, Co, alloys thereof, or combinations thereof.

5. The method according to claim 2, wherein forming the third liner comprises forming a liner having a thickness of about 300 Angstroms or less, and wherein forming the first liner comprises forming a liner having a thickness of about 400 Angstroms or less.

6. The method according to claim 2, further comprising anisotropically etching the seed layer and the third liner to remove the seed layer and the third liner from over the bottom surface of the trench.

7. The method according to claim 6, further comprising depositing an oxide-forming material over the bottom surface of the trench, after anisotropically etching the seed layer and the third liner, wherein forming the first liner comprises electroless plating of the first liner onto the seed layer on the sidewalls of the trench, wherein the oxide-forming material comprises a material that is stable in a plating bath for the electroless plating, further comprising removing the oxide-forming material before filling the trench with the conductive material.

8. The method according to claim 7, wherein depositing the oxide-forming material comprises forming about 10 nm or less of Ta, TaN, SiN, or $SiO_2$.

9. The method according to claim 1, wherein depositing the seed layer comprises depositing about 20 nm or less of a metal.

10. The method according to claim 1, further comprising anisotropically etching the seed layer to remove the seed layer from over the bottom surface of the trench.

11. The method according to claim 10, wherein forming the first liner comprises electroless plating the first liner onto the seed layer on the sidewalls of the trench.

12. The method according to claim 1, further comprising depositing an organic material over the seed layer, before forming the first liner, and removing the organic material from over the sidewalls of the trench, wherein forming the first liner comprises forming the first liner only on the sidewalls of the trench over the seed layer, further comprising removing the organic material before filling the trench with the conductive material.

13. The method according to claim 12, wherein depositing the organic material comprises depositing about 10 nm of pentazene.

14. The method according to claim 12, wherein removing the organic material from over the sidewalls of the trench comprises an isotropic etch using a hydrogen plasma or $CO/NH_3$ etch.

15. The method according to claim 1, further comprising forming a second seed layer over the bottom surface of the trench and over the first liner on the sidewalls of the trench, before filling the trench with the conductive material.

16. The method according to claim 15, wherein forming the second seed layer comprises forming about 900 Angstroms or less of Cu or Ag.

17. The method according to claim 15, further comprising forming a barrier layer over the bottom surface of the trench and over the first liner on the sidewalls of the trench, before forming the seed layer.

18. The method according to claim 15, wherein forming the barrier layer comprises forming about 300 Angstroms or less of Ta, TasN, WN, TiN, or combinations thereof.

19. The method according to claim 1, wherein forming the second liner over at least the conductive material within the trench comprises depositing the second ferromagnetic material over the insulating layer and at least the conductive material, and removing the second ferromagnetic material from over at least the insulating layer.

20. The method according to claim 1, wherein forming the second liner over at least the conductive material within the trench comprises selectively electrolessly depositing the second ferromagnetic material over at least the conductive material.

21. The method according to claim 1, wherein forming the second liner over at least the conductive material within the trench comprises:
   recessing at least the conductive material within the trench; and
   depositing the second ferromagnetic material over at least the conductive material.

22. The method according to claim 21, wherein recessing at least the conductive material further comprises recessing the first liner, and wherein depositing the second ferromagnetic material includes depositing the second ferromagnetic material over the first liner.

23. The method according to claim 21, further comprising forming a first diffusion barrier over at least the recessed conductive material, before depositing the second ferromagnetic material.

24. The method according to claim 23, wherein forming the first diffusion barrier comprises forming about 300 Angstroms or less of Ta, TaN, WN, TiN, or combinations thereof.

25. The method according to claim 23, further comprising forming a second diffusion barrier over at least the recessed conductive material, after depositing the second ferromagnetic material.

26. The method according to claim 25, wherein forming the second diffusion baffler comprises forming about 300 Angstroms or less of Ta, TaN, WN, TiN, or combinations thereof.

27. The method according to claim 1, wherein forming the second liner comprises forming about 400 Angstroms or less of Ni, Fe, Co, alloys thereof, or combinations thereof.

28. The method according to claim 1, wherein forming the second liner comprises forming the second liner over at least a portion of the first liner.

29. The method according to claim 1, wherein forming the second liner comprises forming the second liner over substantially all of the first liner.

30. The method according to claim 1, wherein the second ferromagnetic material comprises the same material as the first ferromagnetic material.

31. The method according to claim 1, wherein the second ferromagnetic material comprises a different material than the first ferromagnetic material.

* * * * *

UNITED STATES PATENT AND TRADEMARK OFFICE
CERTIFICATE OF CORRECTION

PATENT NO. : 7,344,896 B2 Page 1 of 1
APPLICATION NO. : 10/899488
DATED : March 18, 2008
INVENTOR(S) : Leuschner et al.

It is certified that error appears in the above-identified patent and that said Letters Patent is hereby corrected as shown below:

Col. 11, line 31, delete "RWE" and insert --RIE--.
Col. 14, line 65, delete "baffler" and insert --barrier--.

Signed and Sealed this

First Day of July, 2008

JON W. DUDAS
*Director of the United States Patent and Trademark Office*